United States Patent [19]
// Kobayashi et al.

[11] Patent Number: 5,460,917
[45] Date of Patent: Oct. 24, 1995

[54] POSITIVE WORKING PHOTOSENSITIVE LITHOGRAPHIC PRINTING PLATE UTILIZING PHENOL DERIVATIVE COMPOUND CONTAINING PHOTOSENSITIVE COMPOSITION

[75] Inventors: Fumikazu Kobayashi; Kazuyoshi Mizutani; Akira Nagashima, all of Shizuoka, Japan

[73] Assignee: Fujo Photo Film Co., Ltd., Tokyo, Japan

[21] Appl. No.: 296,425

[22] Filed: Aug. 26, 1994

[30] Foreign Application Priority Data

Aug. 31, 1993 [JP] Japan ................. 5-215807

[51] Int. Cl.$^6$ .................................................. G03F 7/023
[52] U.S. Cl. ........................ 430/165; 430/191; 430/192; 430/271
[58] Field of Search .................. 430/165, 191, 430/192, 271

[56] References Cited

U.S. PATENT DOCUMENTS

| | | | |
|---|---|---|---|
| 4,387,152 | 6/1983 | Stahlhofen | 430/191 |
| 5,112,719 | 5/1992 | Yamada et al. | 430/191 |
| 5,238,775 | 8/1993 | Kajita et al. | 430/191 |
| 5,340,686 | 8/1994 | Sakaguchi et al. | 430/191 |

*Primary Examiner*—Charles L. Bowers, Jr.
*Assistant Examiner*—Christopher G. Young
*Attorney, Agent, or Firm*—Sughrue, Mion, Zinn, Macpeak & Seas

[57] ABSTRACT

A positive working photosensitive lithographic printing plate comprising a support having thereon a photosensitive layer comprising a positive photosensitive composition, wherein the positive photosensitive composition comprises a mixture of (a) a phenol derivative, (b) a water-soluble and aqueous alkali-soluble resin, and (c) o-quinonediazide or a mixture of a compound capable of forming an acid on exposure and a compound having at least one C—O—C group which is decomposable with an acid, and wherein the phenol derivative is a mixture of a compound represented by the following formula (I) and a compound represented by the following formula (II):

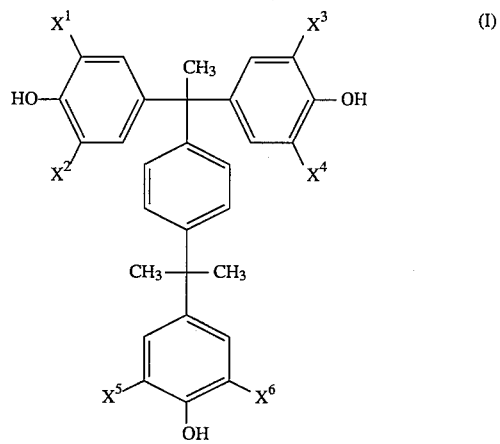

wherein $X^1$, $X^2$, $X^3$, $X^4$, $X^5$ and $X^6$ are the same or different and each represents —$CH_2OH$ or a hydrogen atom, provided that at least three of them are each —$CH_2OH$;

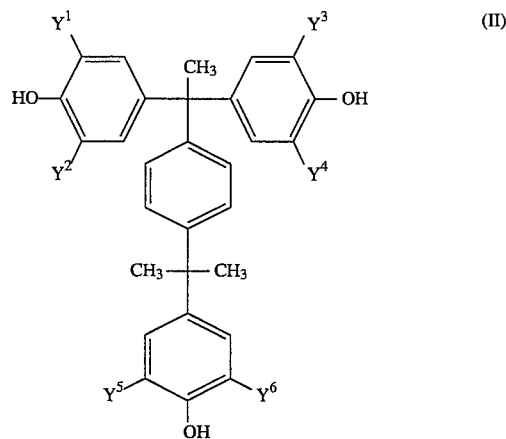

wherein $Y^1$, $Y^2$, $Y^3$, $Y^4$, $Y^5$ and $Y^6$ are the same or different and each represents —$CH_2OCH_3$, —$CH_2OH$ or a hydrogen atom, provided that at least three of them are each —$CH_2OCH_3$ or —$CH_2OH$, and at least one of the three is —$CH_2OCH_3$.

7 Claims, No Drawings

5,460,917

POSITIVE WORKING PHOTOSENSITIVE LITHOGRAPHIC PRINTING PLATE UTILIZING PHENOL DERIVATIVE COMPOUND CONTAINING PHOTOSENSITIVE COMPOSITION

FIELD OF THE INVENTION

This invention relates to a positive working lithographic printing plate, and more particularly to a positive working lithographic printing plate having a photosensitive layer comprising a water-insoluble and alkali-soluble resin.

BACKGROUND OF THE INVENTION

A plate making method of exposing a positive working photosensitive lithographic plate, developing it, and subjecting it to heat processing (hereinafter referred to as burning-in processing) is known as disclosed in British Patents 1,151,199 and 1,154,749. Burning-in processing is usually carried out at from 200° to 320° C. for 1 to 60 minutes. This processing hardens the image area to provide markedly improved impression capacity but, at the same time, causes an ink-receptive organic substance dissolved out of the dot image area to firmly adhere to the non-image area, especially shadows, which appears as stains on printing. This phenomenon is called burning-in ink spreading. It is known that burning-in ink spreading becomes conspicuous as the temperature of burning-in increases.

In order to overcome this problem, JP-B-1-49932 (the term "JP-B" as used herein means an "examined Japanese patent publication") mentions hydrophilic additives for increasing impression capacity after burning-in processing. It is described that impression capacity equal to that reached by burning-in processing at a generally employed burning-in processing temperature of from 200° to 320° C. can be attained by a processing at a reduced burning-in processing, e.g., about 180° C. In fact, however, even processing at 180° C. still causes burning-in ink spreading. It also turned out that the burning-in ink spreading considerably occurs if burning-in processing is effected at a generally employed temperature. Therefore, the above technique offers no basic solution to the problem. Additionally, the hydrophilic additives should be used in a large quantity, which results in serious reductions in other printing properties, such as development latitude and ink-receptivity.

Having high hydrophilic properties, these additives have insufficient solubility in solvents preferably used for coating, such as methyl ethyl ketone and, if added in large quantities, tend to dissolve out from the image area during development.

SUMMARY OF THE INVENTION

An object of the present invention is to provide a positive working photosensitive lithographic printing plate which causes no scum (burning-in ink spreading) even when a high temperature burning-in processing is conducted in the preparation thereof.

Another object of the present invention is to provide a positive working photosensitive lithographic printing plate which exhibits broad development latitude and provides a lithographic plate having satisfactory ink-receptivity.

A further object of the present invention is to provide a positive working photosensitive lithographic printing plate in which the photosensitive layer contains an additive for eliminating burning-in ink spreading, the additive being prevented from precipitation in a coating composition or on the plate and therefore ensuring stabilized printing quality.

A still further object of the present invention is to provide a positive working photosensitive lithographic printing plate which hardly undergoes reduction in thickness of the photosensitive layer due to dissolution of the image area during development.

As a result of extensive investigations, the inventors have found that these and other objects of the present invention are accomplished by the following invention.

The present invention provides a positive working photosensitive lithographic printing plate comprising a support having thereon a photosensitive layer comprising a positive working photosensitive composition, wherein the positive working photosensitive composition comprises a mixture of (a) a phenol derivative, (b) a water-soluble and aqueous alkali-soluble resin, and (c) o-quinonediazide or a mixture of a compound capable of forming an acid on exposure and a compound having at least one C—O—C group which is decomposable with an acid, and wherein the phenol derivative is a mixture of a compound represented by the following formula (I) and a compound represented by the following formula (II):

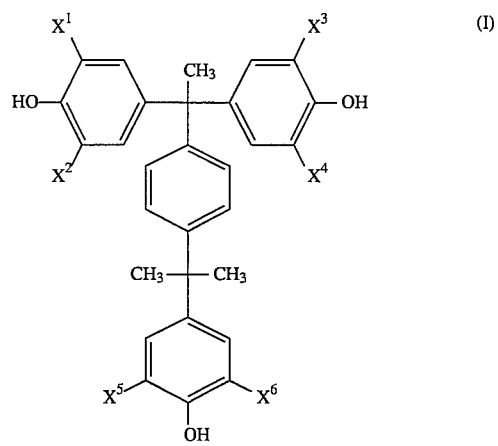

(I)

wherein $X^1$, $X^2$, $X^3$, $X^4$, $X^5$ and $X^6$ are the same or different and each represents —$CH_2OH$ or a hydrogen atom, provided that at least three of them are each —$CH_2OH$;

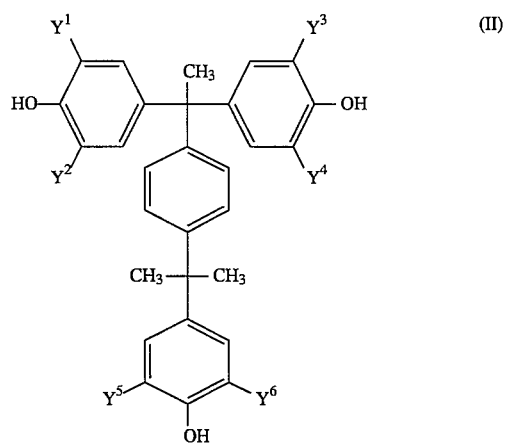

(II)

wherein $Y^1$, $Y^2$, $Y^3$, $Y^4$, $Y^5$ and $Y^6$ are the same or different and each represents —$CH_2OCH_3$, —$CH_2OH$ or a hydrogen atom, provided that at least three of them are each —$CH_2OCH_3$ or —$CH_2OH$, and at least one of the three is

—$CH_2OCH_3$.

DETAILED DESCRIPTION OF THE INVENTION

In formulae (I) and (II), it is preferable that four or more of $X^1$, $X^2$, $X^3$, $X^4$, $X^5$ and $X^6$ each represents —$CH_2OH$; and four or more of $Y^1$, $Y^2$, $Y^3$, $Y^4$, $Y^5$ and $Y^6$ each represents —$CH_2OCH_3$ or —$CH_2OH$, provided that at least one of them is —$CH_2OCH_3$. It is more preferable that all of $X^1$, $X^2$, $X^3$, $X^4$, $X^5$ and $X^6$ each represents —$CH_2OH$; and all of $Y^1$, $Y^2$, $Y^3$, $Y^4$, $Y^5$ and $Y^6$ each represents —$CH_2OCH_3$ or —$CH_2OH$, provided that at least one of them is —$CH_2OCH_3$.

The compound represented by formula (I) and the compound represented by formula (II) are preferably used at a weight ratio of from 98:2 to 10:90, more preferably from 95:5 to 20:80, and most preferably from 90:10 to 30:70.

The combined use of the compound represented by formula (I) and the compound represented by formula (II) produces an effect of preventing scumming (burning-in ink spreading), the main object of the present invention, while eliminating unfavorable problems which would have been associated with the compound represented by formula (I) used alone, such as precipitation of the compound from the coating composition or the photosensitive layer and dissolution of the image area during development, and problems which would have accompanied the compound represented by formula (II) used alone, such as a reduction in sensitivity.

The positive working photosensitive composition to which the above-described phenol derivatives of the present invention are added includes conventionally known photosensitive compositions mainly comprising an o-quinonediazide compound and an alkali-soluble binder and preferably those in which the alkali-soluble binder is a phenolic resin.

The o-quinonediazide compound is a compound having at least one o-quinonediazide group which increases its alkali-solubility upon irradiation with active light rays. In the present invention, o-quinonediazide compounds of various structures can be used. For example, the compounds described in J. Kosar, *Light-Sensitive Systems,* pp. 339–352, John Wiley & Sons, Inc. (1965) can be used. In particular, sulfonic esters or sulfonic amides of o-quinonediazide prepared by reacting o-quinonediazide and an aromatic polyhydroxyl compound or an aromatic amino compound are preferred. Ester between benzo-quinone-1,2-diazidosulfonyl chloride or naphtho-quinone-1,2-diazido-5-sulfonyl chloride and a pyrogallol-acetone resin described in JP-B-43-28403, and ester between benzo-quinone-1,2-diazidosulfonyl chloride or naphtho-quinone-1,2-diazido-5-sulfonyl chloride and a phenol-formaldehyde resin described in U.S. Pat. Nos. 3,046,120 and 3,188,210 are also suitable.

In addition, ester between naphtho-quinone-1,2-diazido-4-sulfonyl chloride and a phenol-formaldehyde resin or a cresol-formaldehyde resin and ester between naphtho-quinone- 1,2-diazido-4-sulfonyl chloride and a pyrogallol-acetone resin are suitably used. Other useful o-quinonediazide compounds have been described in many patents, such as JP-A-47-5303 (the term "JP-A" as used herein means an "unexamined published Japanese patent application"), JP-A-48-63802, JP-A-48-63803, JP-A-48-96575, JP-A-49-38701, JP-A-48-13354, JP-B-41-11222, JP-B-45-9610, JP-B-49-17481, U.S. Pat. Nos. 2,797,213, 3,454,400, 3,544,323, 3,573,917, 3,674,495 and 3,785,825, British Patents 1,227,602, 1,251,345, 1,267,005, 1,329,888 and 1,330,932, and German Patent 854,890.

These o-quinonediazide compounds may be used either individually or in combination of two or more thereof. The o-quinonediazide compound is preferably used in an amount of from 1 to 50% by weight, more preferably from 5 to 30% by weight, based on the total solids content of the photosensitive composition.

A mixture of a compound capable of forming an acid on exposure (acid-producing compound) and a compound having at least one C—O—C group which is decomposable with an acid (acid-decomposable compound) may be used in place of the o-quinonediazide compound. Materials containing the mixture of the acid-producing compound and the acid-decomposable compound are known as disclosed, e.g., in U.S. Pat. Nos. 3,779,778 and 4,101,323, West German Patent 2,718,254, and West German Patent Laid-Open Nos. 2,829,512 and 2,829,511. These materials contain an orthocarboxylic acid derivative, an acetal or a polymer thereof, an enol ether or an acylimino carbonate as an acid-decomposable compound in combination with a photosensitive and acid-producing compound, such as an organohalogen compound, particularly a halogenomethyl-substituted s-triazine derivative.

Of the orthocarboxylic acid derivatives described in U.S. Pat. No. 4,101,324, a bis-1,3-dioxan-2-yl ether of an aliphatic diol is particularly preferred.

Of the polyacetal described in West German Patent 2,718,254, those having an aliphatic aldehyde unit and a diol unit are preferably used.

An extremely preferred system is a mixture containing a polymeric orthoester having a recurring orthoester group in the main chain thereof as an acid-decomposable compound, disclosed in West German Patent Laid-Open No. 2,928,636. The above recurring group is 2-alkyl ether of a 1,3-dioxacycloalkane having a 5- or 6-membered ring. A polymer having a 1,3-dioxacyclohex-2-yl alkyl ether unit, in which the alkyl ether group may contain therein an ethereal oxygen atom and is preferably bonded to the 5-position of the adjacent ring, is particularly preferred.

The acid-decomposable compound is usually used in an amount of from 8 to 65% by weight, preferably from 14 to 44% by weight, based on the total solids content of the photosensitive composition. The acid-producing compound is usually used in an amount of from 0.1 to 10% by weight, preferably from 0.2 to 5% by weight, based on the total solids content of the photosensitive composition.

The water-insoluble and aqueous alkali-soluble resin which can be used in the present invention include various kinds of resins having such properties. Suitable resins include novolak resins, such as phenol-formaldehyde resins, cresol-formaldehyde resins (e.g., m-cresol-formaldehyde resins, p-cresol-formaldehyde resins, o-cresol-formaldehyde resins, m-/p-mixed cresol-formaldehyde resins, and phenol/cresol (any of m-, p-, o-, m-/p-mixed, m-/o-mixed and o-/p-mixed cresol) mixed-formaldehyde resins), and resol type phenolic resins. Preferred of them are phenol/cresol (any of m-, p-, o-, m-/p-mixed, m-/o-mixed and o-/p-mixed cresol) mixed-formaldehyde resins, with the phenolic resins described in JP-A-61-217034 being particularly preferred.

Other alkali-soluble resins, such as phenol-modified xylene resins, polyhydroxystyrene, poly(halogenated hydroxystyrene), acrylic resins having a phenolic hydroxyl group described in JP-A-51-34711, acrylic resins having a sulfonamido group described in JP-A-2-866, and urethane resins, are also employable. These alkali-soluble resins (high polymers) preferably have a weight average molecular weight of from 500 to 200,000 and a number average molecular weight of from 200 to 60,000.

The water-insoluble and alkali-soluble resins may be used either individually or in combination of two or more thereof. They are used in an amount usually of from 5 to 99% by weight, preferably of from 10 to 90% by weight, based on the total solids content of the photosensitive composition.

If desired, the positive working photosensitive composition may contain various additives.

For example, addition of a condensate of a phenol having an alkyl group having from 3 to 8 carbon atoms as a substituent with formaldehyde, such as an octylphenol-formaldehyde resin, is effective to improve ink-receptivity of the image area.

For the purpose of further improving sensitivity, cyclic acid anhydrides, phenol compounds, or organic acids may be added. Suitable examples of the cyclic acids anhydride include phthalic anhydride, tetrahydrophthalic anhydride, hexahydrophthalic anhydride, 3,6-endoxy-$\Delta^4$-tetrahydrophthalic anhydride, tetrachlorophthalic anhydride, maleic anhydride, chloromaleic anhydride, α-phenylmaleic anhydride, succinic anhydride and pyromellitic anhydride described in U.S. Pat. No. 4,115,128. Suitable examples of the phenol compound are bisphenol A, p-nitrophenol, p-ethoxyphenol, 2,4,4'-trihydroxybenzophenone, 2,3,4-trihydroxybenzophenone, 4-hydroxybenzophenone, 4,4',4''-trihydroxytriphenylmethane and 4,4',3'',4''-tetrahydroxy-3, 5,3',5,'-tetramethyltriphenylmethane. Suitable examples of the organic acids include sulfonic acids, sulfinic acids, alkylsulfates, phosphonic acids, phosphoric esters and carboxylic acids described in JP-A-60-88942 and JP-A-2-96755. Specific examples of the organic acids are p-toluenesulfonic acid, dodecylbenzenesulfonic acid, p-toluenesulfinic acid, ethyl sulfate, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene- 1,2-dicarboxylic acid, erucic acid, lauric acid, n-undecanoic acid and ascorbic acid.

The above-mentioned cyclic acid anhydride, phenol compound or organic acid is preferably used in an amount of from 0.05 to 15% by weight, more preferably from 0.1 to 5% by weight, based on the total solids content of the photosensitive composition.

For the purpose of improving stability against changes of development conditions, an nonionic surface active agent described in JP-A-62-251740 and JP-A-3-208514 or an amphoteric surface active agent described in JP-A-59-121044 and JP-A-4-13149 may be added to the photosensitive composition.

Specific examples of suitable nonionic surface active agents include sorbitan tristearate, sorbitan monopalmitate, sorbitan trioleate, glycerol monostearate, and polyoxyethylene nonylphenyl ether.

Specific examples of suitable amphoteric surface active agents include alkyldi(aminoethyl)glycines, alkyl polyaminoethylglycine hydrochlorides, 2-alkyl-N-carboxyethyl-N-hydroxyethylimidazolinium betaines and N-tetradecyl-N,N-betaines (e.g., Amogen K, produced by Dai-ichi Kogyo Seiyaku Co., Ltd.).

The nonionic or amphoteric surface active agent is preferably used in an amount of from 0.05 to 15% by weight, more preferably from 0.1 to 5% by weight, based on the total solids content of the photosensitive composition.

The photosensitive composition may furthermore contain a dye or a pigment as a printing-out agent for obtaining a visible image immediately after exposure or as an image coloring agent.

Examples of the printing-out agent include a combination of a compound capable of releasing an acid on exposure (photo acid-releasing agent) and an organic dye capable of forming a salt, such as a combination of an o-naphthoquinonediazide- 4-sulfonyl halogenide and a salt-forming organic dye described in JP-A-50-36209 and JP-A-53 -8128 and a combination of a trihalomethyl compound and a salt-forming organic dye described in JP-A-53-36223, JP-A-54 -74728, JP-A-60-3626, JP-A-61-143748, JP-A-61-151644 and JP-A- 63-58440. Examples of the trihalomethyl compound include oxazole compounds and triazine compounds, both of which have excellent stability with time and provides a clear visible image.

The image coloring agents include oil-soluble dyes and basic dyes as well as the above-mentioned salt-forming organic dyes. Specific examples of suitable dyes are Oil Yellow #101, Oil Yellow #103, Oil Pink #312, Oil Green BG, Oil Blue BOS, Oil Blue #603, Oil Black BY, Boil Black BS, and Oil Black T-505 (produced by Orient Chemical Industries Co., Ltd.); Victoria Pure Blue, Crystal Violet (C.I. 42555), Methyl Violet (C.I. 42535), Ethyl Violet, Rhodamine B (C.I. 145170B), Malachite Green (C.I. 42000) and Methylene Blue (C.I. 52015). The dyes described in JP-A-62-293247 are more preferred. These dyes are used in an amount usually of from 0.01 to 10% by weight, preferably of from 0.1 to 3% by weight, based on the total solids content of the photosensitive composition.

If desired, the photosensitive composition may furthermore contain a plasticizer for imparting softness to the coating film. Examples of the plasticizer include butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate and an oligomer or polymer of acrylic acid or methacrylic acid.

The positive working lithographic printing plate according to the present invention is produced by coating an appropriate support with the aforementioned photosensitive composition as dissolved in an appropriate solvent. The solvent is not particularly limited, however, examples of the solvent include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone and toluene.

These solvents may be used either individually or in combination thereof. The coating composition preferably has a concentration (total solids content inclusive of additives) of from 1 to 50% by weight. The coating composition is applied to a dry coating weight usually of from 0.5 to 5.0 g/m$^2$, though varying depending on the end use. Coating is carried out by various methods, such as bar coating, spin coating, spray coating, curtain coating, dip coating, air knife coating, blade coating and roll coating. As the coating weight is decreased, the apparent sensitivity increases while the film characteristics of the photosensitive layer are reduced.

The photosensitive layer may contain a surface active agent for improving coating properties, such as a fluorine surface active agent described in JP-A-62-170950. The surface active agent is preferably added in an amount of from 0.01 to 1% by weight, more preferably of from 0.05 to 0.5% by weight, based on the total solids content of the photosensitive composition.

The support which can be used in the present invention is a flat plate having dimensional stability, such as paper, plastic-laminated paper (e.g., polyethylene, polypropylene, or polystyrene-laminated paper), a metal plate (e.g., aluminum, zinc, copper), a plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal) and paper or a plastic film on which the aforementioned metal is laminated or deposited.

Preferred of these supports is a relatively inexpensive aluminum plate, and particularly a plate of pure aluminum or an aluminum alloy containing minor proportions of different elements, or an aluminum-laminated or deposited plastic film. Examples of the different elements in the aluminum alloys include silicon, iron, manganese, copper, magnesium, chromium, zinc, bismuth, nickel and titanium. The content of these different elements in the aluminum alloys is 10% by weight or less. While pure aluminum is particularly preferred as an aluminum material, perfectly pure aluminum is difficult to produce by the current refining technique so that existence of a trace amount of different elements in "pure aluminum" is allowable. Thus, the aluminum plates applicable to the present invention are not specified by their composition, and those made of known materials may be utilized appropriately. The aluminum plate to be used usually has a thickness of from about 0.1 to 0.6 mm.

The aluminum plate is subjected to surface graining. If desired, graining may be preceded by degreasing with a surface active agent, an organic solvent or an aqueous alkali solution for removing rolling oil from the surface thereof. Examples of surface graining include mechanically surface graining, electrochemically surface graining by dissolving the surface or chemically surface graining by selectively dissolving the surface. For example, mechanical graining is carried out according to the known methods such as ball milling, brushing, blasting and buffing. Electrochemical graining may be carried out in a hydrochloric acid electrolytic solution or a nitric acid electrolytic solution using an alternating current or a direct current. The method in combination of mechanical graining and electrochemical graining disclosed in JP-A-54-63902 may be used.

If desired, the thus grained aluminum plate may be subjected to alkali etching processing and neutralization processing. Further, if desired, the aluminum plate may be subjected to anodizing processing in order to improve water receptivity and wear. In carrying out anodizing the aluminum plate, various electrolytes capable of forming a porous anodized layer, generally including sulfuric acid, phosphoric acid, oxalic acid, chromic acid and a mixture thereof, are used. The concentration of the electrolyte is appropriately decided according to the kind of the electrolyte.

Anodizing conditions are subject to variation depending on the electrolyte used. In general, the anodizing processing is carried out under conditions of an electrolyte concentration of from 1 to 80% by weight, a liquid temperature of from 5° to 70° C., a current density of from 5 to 60 A/dm$^2$, a voltage of from 1 to 100 V, and an electrolysis time of from 10 seconds to 5 minutes.

The thickness of the anodized layer is preferably 1.0 g/m$^2$ or more. When it is less than 1.0 g/m$^2$, the non-image area of the resulting lithographic printing plate is likely to suffer from scratching scum, to which an ink adheres to cause scratch marks on printing.

If desired, the anodized aluminum surface may be subjected to hydrophilic processing. Examples of the hydrophilic processing include an alkali metal silicate (e.g., sodium silicate) method comprising immersing or electrolytically decomposing the aluminum plate in a sodium silicate aqueous solution (see U.S. Pat. Nos. 2,714,066, 3,181,461, 3,280,734 and 3,902,734), and a method comprising processing the surface with potassium fluorozirconate (see JP-B-36-22063) or polyvinylphosphonic acid (see U.S. Pat. Nos. 3,276,868, 4,153,461 and 4,689,272).

The positive working photosensitive lithographic printing plate of the present invention comprises a support having thereon a positive working photosensitive layer, however, if desired, a subbing layer and a matting layer may be provided between the support and the photosensitive layer and on the photosensitive layer, respectively.

The subbing layer is prepared from various organic compounds, and examples of the organic compounds include carboxymethyl cellulose, dextrin, gum arabic, amino-containing phosphonic acids (e.g., 2-aminoethylphosphonic acid), substituted or unsubstituted organophosphonic acids (e.g., phenylphosphonic acid, naphthylphosphonic acid, alkylphosphonic acids, glycerophosphonic acid, methylenediphosphonic acid, ethylenediphosphonic acid), substituted or unsubstituted organophosphoric acids (e.g., phenylphosphoric acid, naphthylphosphoric acid, alkylphosphoric acids, glycerophosphoric acid), substituted or unsubstituted organophosphinic acids (e.g., phenylphosphinic acid, naphthylphosphinic acid, alkylphosphinic acids, glycerophosphinic acid), amino acids (e.g., glycine, β-alanine), hydroxy-containing amine hydrochlorides (e.g., triethanolamine hydrochloride), and mixtures of two or more thereof.

The subbing layer can be formed by a method, wherein an aluminum plate is coated with a solution of the above-described organic compound dissolving in water, an organic solvent (e.g., methanol, ethanol, methyl ethyl ketone) or a mixture thereof and dried; or a method, wherein an aluminum is immersed in the above-described solution of the organic compound in order to absorb the organic compound, washed with, for example, water, and dried. In the former method, the solution of the organic compound has a concentration of from 0.05 to 10% by weight, and coating is carried out by the various methods. In the latter method, the solution of the organic compound has a concentration of from 0.01 to 20% by weight, preferably from 0.5 to 5% by weight; an immersing temperature is from 20° to 90° C., preferably from 25° to 50° C.; and an immersing time is from 0.1 second to 20 minutes, preferably from 2 seconds to one minute. The solution may be adjusted to a pH between 1 and 12 with a basic substance, such as ammonia, triethylamine or potassium hydroxide, or an acidic substance, such as hydrochloric acid or phosphoric acid. A yellow dye may be added to the solution for improving tone reproducibility.

The coated amount of the subbing layer is from 2 to 200 mg/m$^2$, preferably from 5 to 100 mg/m$^2$. When the coated amount is less than 2 mg/m$^2$, the resulting printing plate is likely to have insufficient press life. When the coated amount is more than 200 mg/m$^2$, the result is the same.

The matting layer, which may be provided on the photosensitive layer, is for reduction of the time required for evacuation in contact exposure using a vacuum printing frame and for prevention of lack of sharpness in printing. The matting layer can be formed by the method, for example, described in JP-A-50-125805, JP-B-57-6582 and JP-B-61-28986 or by heat fusion of solid powder described in JP-B-62-62337.

The matting layer preferably has an average particle size of 100 μm or less, more preferably from 2 to 8 μm. Too large an average particle size is unfavorable for toner reproduction with the result that printing of fine lines is difficult and the number of highlight dots is reduced. When the average particle size is less than 2 μm, vacuum contact is insufficient, and lack of sharpness in printing occurs. The coated amount of the matting layer is preferably from 5 to 200 mg/m$^2$, more preferably from 20 to 150 mg/m$^2$. When the coated amount exceeds 150 mg/m$^2$, scratching occurs. When it is less than 20 mg/m$^2$, vacuum contact is insufficient.

The thus prepared positive working photosensitive lithographic printing plate is usually imagewise exposed to light and then developed.

Examples of light source of active light rays for imagewise exposure includes a mercury lamp, a metal halide lamp, a xenon lamp, a chemical lamp and a carbon arc lamp. Examples of radiations include electron beams, X-rays, ion beams and far infrared rays. Further, g-lines, i-lines, deep UV light and high-density energy beams (laser beams) are also used. Examples of laser beams include a helium-neon laser, an argon laser, a krypton laser, a helium-cadmium laser and a KrF excimer laser.

For development processing, known aqueous alkali solutions can be used as a developinger and a replenisher. Examples of suitable alkalis include inorganic alkali salts, such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide; and organic alkalis, such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine. These alkalis may be used either individually or in combination of two or more thereof.

Among the developers containing the above alkalis, preferred is an aqueous solution of a silicate, such as sodium silicate or potassium silicate, for the advantage that the developing ability is controllable by adjustments of the molar ratio and concentration of silicon oxide ($SiO_2$) and an alkali metal oxide ($M_2O$) which constitute a silicate. For example, the alkali metal silicates described in JP-A-54-62004 and JP-B-57-7427 are effectively used.

When development is conducted with an automatic developing machine, it is recommended to replenish a developing tank containing a developer with a solution (replenisher) having a higher alkali strength than that of the developer so that a large quantity of PS plates (presensitized plates) may be processed continuously for an extended period of time without exchange of developer.

The developer and replenisher may contain various surface active agents and organic solvents for the purpose of acceleration or restraint of development, diffusion of scum, and improvement of ink-receptivity of the image area of a printing plate. Suitable surface active agents include anionic, cationic, nonionic and amphoteric surface active agents.

The developer and replenisher may further contain a reducing agent (e.g., hydro-quinone, resorcin, sulfurous acid, a sodium or potassium salt of an inorganic acid such as hydrogensulfite), an organic carboxylic acid, an anti-foam fluid and a water softener.

After the development, the resulting printing plate is post-treated with wash water, a rinsing solution containing, for example, a surface active agent, or desensitizing solution containing gum arabic or a starch derivative. These post-processing may be combined appropriately.

An automatic developing machine has recently spread in the field of plate making and printing for rationalization and standardization of plate making operation. An automatic developing machine is generally divided into a developing part and post-processing part, comprising a means for carrying a printing plate or tanks containing each processing solution, and spraying means for each processing solution, in which each processing solution is pumped up and sprayed from nozzles onto a horizontally moving exposed printing plate. A system in which a plate is soaked in a processing solution in a tank by means of guide rolls has recently come to be known. As stated above, development using such an automatic developing machine can be carried out while adding a replenisher to each processing solution in accordance with the volume to be processed, the working time, and the like.

A developing system using disposable processing solutions, in which an exposed printing plate is processed with substantially fresh processing solutions, is also applicable to the printing plate according to the present invention.

In cases where any unnecessary image area (for example, the area corresponding to the edges of the original film) remains in the resulting lithographic plate, such unnecessary image area should be removed preferably by applying an image remover described in JP-B-2-13293 to the area, leaving the applied area to stand for a prescribed period of time, and washing off the area with water. The unnecessary image area may also be removed by irradiating the area with active light rays led by an optical fiber described in JP-A-59-174842 followed by development.

If necessary, the resulting lithographic printing plate is coated with an oil-desensitizing gum.

In order to further enhance printing durability of the printing plate, the printing plate can be subjected to burning-in processing. In this case, burning-in processing is preferably preceded by processing with such a plate burning-in conditioner as described in JP-B-61-2518, JP-B-55-28062, JP-A-62-31859, and JP-A-61-159655. Processing with a plate burning-in conditioner is conducted by applying a sponge or developing pad impregnated with the solution onto the plate, or dipping the plate in a tray filled with the plate burning-in conditioner, or coating the plate with the plate burning-in conditioner by means of an automatic coater. After the above processing, it is desirable to level the applied plate burning-in conditioner by means of a squeegee or a squeegee roll.

The plate burning-in conditioner is generally applied to a dry thickness of from 0.03 to 0.8 g/m$^2$.

The printing plate on which a plate burning-in conditioner has been applied is then, or after being dried if necessary, heated to a high temperature by means of a burning-in processor (e.g., Burning Processor BP-1300 manufactured by Fuji Photo Film Co., Ltd.). While depending on the components constituting the image, the heating is preferably conducted at a temperature of from 180° to 300° C. for a period of from 1 to 20 minutes.

If necessary, the printing plate after burning-in processing may be subjected to conventional processing, such as washing with water and gumming. When a plate burning-in conditioner containing a water-soluble high polymer has been applied, the so-called desensitizing processing such as gumming, may be omitted.

The resulting lithographic printing plate is used for obtaining a great number of prints by, for example, an offset printing machine.

The present invention will now be illustrated in greater detail with reference to the following examples, but it should be understood that the present invention is not to be construed as being limited thereto. All the percents and ratios are by weight unless otherwise indicated.

EXAMPLES

Synthesis Example 1

In a 1 l egg-plant flask were charged 42.4 g (0.10 mol) of 1-[α-methyl-α-(4-hydroxyphenyl)ethyl]-4-[α,α -bis(4-hydroxyphenyl)ethyl]benzene (a product of Honshu Chemical Industry Co., Ltd.), 19.6 g (0.35 mol) of potassium hydroxide and 250 ml of water, and 120 ml (1.5 mol) of a 37% aqueous formalin solution was added thereto. The mixture was stirred at 50° C. for 8 hours. After completion of the reaction, the reaction mixture was poured into 1250 ml of ice-water containing 33.3 ml (0.4 mol) of concentrated hydrochloric acid to precipitate white powder, which was collected by filtration and washed with water. Recrystallization of the powder from methanol/methyl ethyl ketone (1:1) gave 54.8 g of a hexamethylol compound of 1-[α-methyl-α -(4-hydroxyphenyl)ethyl]-4-[α,α-bis(4-hydroxyphenyl)-ethyl] benzene, a compound represented by formula (I) wherein all of $X^1$, $X^2$, $X^3$, $X^4$, $X^5$ and $X^6$ represent a methylol group The resulting compound will hereinafter be referred to as hexamethylol compound A.

Hexamethylol compound A was found to have a purity of 99.2% by liquid chromatography and was identified to be a hexamethylol compound by NMR analysis.

Synthesis Examples 2 to 5

Hexamethylol compound A prepared in Synthesis Example 1 was dissolved in methanol under heating to prepare a 7% solution. The resulting solution was mixed with various compounds represented by formula (II), and the mixture was treated under the conditions shown in Table 1 below.

The composition of the resulting mixtures were analyzed by high performance liquid chromatography (HPCL) and NMR to obtain an HPLC area ratio of hexamethylol compound A to the compounds represented by formula (II) and a ratio of —$CH_2OCH_3$ to —$CH_2OH$ in $X^1$, $X^2$, $X^3$, $X^4$, $X^5$, $X^6$, $Y^1$, $Y^2$, $Y^3$, $Y^4$, $Y^5$ and $Y^6$. The results obtained are shown in Table 1 below.

TABLE 1

| Synthesis Example No. | Treating Conditions | A/(II) HPLC Area Ratio | —$CH_2OCH_3$/ —$CH_2OH$ |
|---|---|---|---|
| 2 | room temp. for 1 week | 95/5 | 2/98 |
| 3 | 50° C. for 24 hours | 81/19 | 6/94 |
| 4 | 35° C. for 2 months | 53/47 | 20/80 |
| 5 | 50° C. for 12 hours, in the presence of $H_2SO_4$* | 0/100 | 95/5 |

TABLE 1-continued

| Synthesis Example No. | Treating Conditions | A/(II) HPLC Area Ratio | —$CH_2OCH_3$/ —$CH_2OH$ |
|---|---|---|---|

Note:
*After the reaction, the mixture was neutralized with $Na_2CO_3$, and the by-product inorganic salts were removed by filtration.

Each of the mixtures prepared in Synthesis Examples 2 to 5 was used as such in the following Examples.

Examples 1 to 4

A 0.3 mm thick aluminum plate (material: 1050) was degreased with trichloroethylene, and the surface was grained with a nylon brush while applying an aqueous suspension of pumice having a particle size of 400 mesh. After thoroughly washed with water, the aluminum plate was etched by soaking in a 25% aqueous sodium hydroxide solution for 9 seconds, washed with water, soaked in 20% nitric acid for 20 seconds, and washed with water. The etched amount of aluminum was about 3 g/m². The aluminum plate was then anodized in 7% sulfuric acid at a direct current density of 15 A/dm² to form an anodized layer to a thickness of 3 g/m², followed by washing with water and drying to prepare an aluminum support.

A coating composition shown below was applied to the aluminum support and dried at 80° C. for 30 seconds to form a subbing layer having a dry weight of 10 mg/m².

| Formulation of Undercoating Layer: | |
|---|---|
| β-Alanine | 0.1 g |
| Phenylphosphonic acid | 0.05 g |
| Methanol | 40 g |
| Pure water | 60 g |

A photosensitive coating composition having the following formulation was further applied to the undercoating layer to a dry coating weight of 2.0 g/m² and dried at 100° C. for 2 minutes to obtain a positive working photosensitive lithographic printing plate.

| Formulation of Photosensitive Solution: | |
|---|---|
| Ester of naphthoquinone-1,2-diazido-5-sulfonyl chloride and a pyrogallol-acetone resin | 0.90 g |
| Cresol-formaldehyde novolak (meta-para ratio = 6:4; weight average molecular weight: 1800; unreacted cresol content: 0.5%) | see Table 2 |
| p-Octylphenol-formaldehyde novolak | 0.02 g |
| Naphthoquinone-1,2-diazido-4-sulfonyl chloride | 0.01 g |
| Phenol derivatives | see Table 2 |
| Tetrahydrophthalic anhydride | 0.05 g |
| 4-(p-N,N-Bis(ethoxycarbonylmethyl)-aminophenyl)-2,6-bis(trichloromethyl)-s-triazine | 0.02 g |
| 4-(p-N-(P-Hydroxybenozyl)aminophenyl)-2,6-bis(trichloromethyl)-s-triazine | 0.02 g |
| Victoria Pure Blue BOH with its counter ion exchanged with 1-naphthalene-sulfonic acid | 0.03 g |
| Megafac F-177 (fluorine surface active agent produced by Dainippon Ink | 0.06 g |

-continued

| Formulation of Photosensitive Solution: | |
|---|---|
| and Chemicals, Inc.) | |
| Methyl ethyl ketone | 20 g |
| Methyl alcohol | 7 g |

Comparative Examples 1 to 9

Positive working photosensitive lithographic printing plates were prepared in the same manner as in Examples 1 to 4, except for replacing the phenol derivatives according to the present invention with each of compounds having formula (III) to (V) shown below, hexamethylol compound A, or the mixture of Synthesis Example 5 as shown in Table 2.

TABLE 2

| Example No. | Amount of Cresol-Form-aldehyde Novolak (g) | Phenol Derivative(s) Kind | Amount (on Solid Basis) (g) |
|---|---|---|---|
| Example 1 | 2.00 | Mixture of Synthesis Example 2 | 0.06 |
| Example 2 | 2.10 | Mixture of Synthesis Example 3 | 0.055 |
| Example 3 | 2.10 | Mixture of Synthesis Example 4 | 0.06 |
| Example 4 | 2.06 | 1:1 Mixture of hexamethylol compound A and mixture of Synthesis Example 5 | 0.06 |
| Compara. Example 1 | 2.16 | — | — |
| Compara. Example 2 | 2.10 | Compound (III) | 0.06 |
| Compara. Example 3 | 1.76 | Compound (III) | 0.40 |
| Compara. Example 4 | 2.06 | Compound (IV) | 0.10 |
| Compara. Example 5 | 1.66 | Compound (IV) | 0.50 |
| Compara. Example 6 | 2.08 | Compound (V) | 0.08 |
| Compara. Example 7 | 1.71 | Compound (V) | 0.45 |
| Compara. Example 8 | 2.10 | Hexamethylol compound A | 0.06 |
| Compara. Example 9 | 2.10 | Mixture of Synthesis Example 5 | 0.06 |

Compounds (III), (IV) and (V) used in Comparative Examples 1 to 7 are represented by the following formulae having 1, 2 and 3 benzene nuclei, respectively, and Compounds (III) and (IV) are described in the examples of JP-B-1-49932:

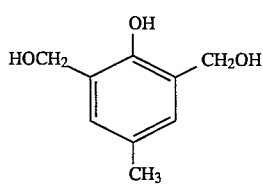
(III)

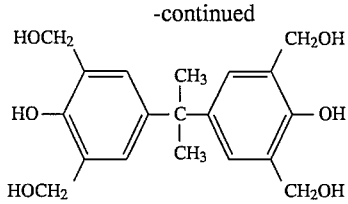
(IV)

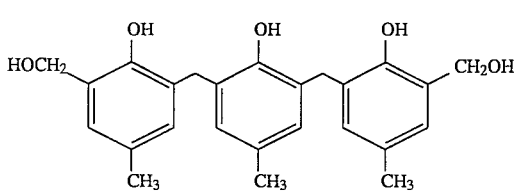
(V)

Each of the resulting positive working photosensitive lithographic printing plates was evaluated according to the following test methods.

1) Sensitivity and Development Latitude:

The positive working photosensitive lithographic plate was exposed to light of a 30 A (ampere) carbon arc lamp placed 70 cm away and automatically developed in an automatic developing machine (800U, manufactured by Fuji Photo Film Co., Ltd.) with 8-fold diluted DP-4 (a developer produced by Fuji Photo Film Co., Ltd.) at 25° C. for 40 seconds. The correct exposure time is such an exposure time by which 5 steps of a gray scale (step guide) having a density difference of 0.15 between adjacent steps (a product of Fuji Photo Film Co., Ltd.) can be completely cleared. The thus determined correct exposure time was taken as a sensitivity of the photosensitive lithographic plate. Further, the time required for making a change in density by two steps from the solid step of the gray scale at the tray development at 25° C. for 40 seconds was measured. This time was taken as a development latitude.

2) Ink-Receptivity:

The photosensitive lithographic printing plate was exposed to light of a halide lamp for 60 seconds in a vacuum printing frame through a positive original film on a transparent base and treated with an automatic developing machine using 9-fold diluted DP-4 and 8-fold diluted FR-3 (a rinsing solution produced by Fuji Photo Film Co., Ltd.). The surface of the thus processed lithographic printing plate was gummed with 2-fold diluted GU-7 produced by Fuji Photo Film Co., Ltd. After allowing the gummed plate to stand for 1 day, printing was carried out on a printer, Heidel KOR-D manufactured by Heidelberger Druckmashinen Aktiengesellschaft. The number of prints required until a satisfactory print was obtained was taken as a measure of ink-receptivity.

3) Impression Capacity and Ink Spreading:

The photosensitive lithographic printing plate was exposed and automatically processed in the same manner as in the above-described test (2). A plate burning-in conditioner for burning-in, BC-3 produced by Fuji Photo Film Co., Ltd., was applied to the surface of the processed photosensitive lithographic printing plate, and the plate was subjected to burning-in processing in a burning-in apparatus, BP-1300, at a prescribed temperature for 7 minutes. The plate surface was gummed with GU-7 double diluted with water. After allowing the plate to stand for 1 day, printing was carried out on Heidel KOR-D.

The number of prints obtained with satisfactory image quality was taken as a measure of printing durability, and the degree of ink spreading on the halftone dot image area was observed.

The degree of ink spreading on the halftone dot image area was graded on a scale of A to E from lowest to highest (A: no ink spreading; B: little ink spreading; C: slight ink spreading; D: ink spreading observed; E: serious ink spreading; A': between A and B; C': between C and D; D': between D and E).

4) Degree of Dissolution of Image Area:

The degree of dissolution of the image area during development processing was graded on a scale of A to C from lowest to highest (A: no; B: little; C: slight).

5) Degree of Precipitation of Phenol Compound:

The degree of precipitation of the phenol compound(s) from the solvent (methyl ethyl ketone/methanol) was observed at a varied temperature and graded on a scale of A to C (A: no at 0° to 30° C.; B: little at 10° C.; C: slight at 10° C.).

The results of these measurements and observations are shown in Table 3 below.

Although the compounds described in JP-B-1-49932 achieve slight effect on sensitivity as observed in Comparative Examples 2 to 5, they bring about a great reduction in development latitude when added in increased amounts as in Comparative Examples 3 and 5, failing to simultaneously satisfy both impression capacity and development latitude.

It is also seen that the printing plates of Comparative Examples 3 and 5, which are in accordance with JP-B-1-49932 (corresponding to U.S. Pat. No. 4,387,152) aiming at an improvement in impression capacity, undergo serious deterioration in ink receptivity and incur a great loss of paper before obtaining satisfactory prints.

In Comparative Example 8 in which only hexamethylol compound A is used as a phenol derivative, dissolution of the image area is observed at the time of development processing. Such a drawback can be eliminated in Examples 1 to 4.

On the other hand, in Comparative Example 9 in which only compound represented by formula (II) is used as a

TABLE 3

| Example No. | Sensitivity (sec) | Development Latitude (min) | Ink Receptivity | Burning-in Temperature | | | | | | Image Area Dissolution | Precipitation |
|---|---|---|---|---|---|---|---|---|---|---|---|
| | | | | 180° C. | | 220° C. | | 250° C. | | | |
| | | | | Impression Capacity ($\times 10^4$) | Interlocking | Impression Capacity ($\times 10^4$) | Interlocking | Impression Capacity ($\times 10^4$) | Interlocking | | |
| Example 1 | 40 | 6 | 7 | 25 | A | 35 | A | 45 | B | B | A |
| Example 2 | 45 | 6 | 7 | 25 | A | 35 | A | 45 | B | B | A |
| Example 3 | 50 | 6 | 7 | 23 | A | 32 | A | 43 | B | A | A |
| Example 4 | 50 | 6 | 7 | 25 | A | 33 | A | 43 | B | B | A |
| Compara. Example 1 | 65 | 7 | 7 | 15 | C' | 22 | D | 30 | E | A | — |
| Compara. Example 2 | 55 | 5 | 9 | 15 | C' | 23 | D | 32 | E | C | B |
| Compara. Example 3 | 50 | 2 | >100 | 30 | D | 40 | D' | 50 | E | C | C |
| Compara. Example 4 | 55 | 5 | 9 | 15 | C' | 22 | D | 33 | E | C | B |
| Compara. Example 5 | 50 | 2 | >100 | 30 | D | 42 | D' | 50 | E | C | C |
| Compara. Example 6 | 55 | 5 | 10 | 15 | C' | 22 | D | 33 | E | C | B |
| Compara. Example 7 | 50 | 2.5 | >100 | 31 | C' | 38 | D | 50 | E | C | C |
| Compara. Example 8 | 40 | 6 | 7 | 25 | A | 35 | A | 45 | B | C | C |
| Compara. Example 9 | 60 | 7 | 7 | 22 | A | 30 | A' | 43 | B | A | A |

The results in Table 3 reveal the following facts. When presensitized printing plate (PS plates) of Examples 1 to 4, in which the phenol derivatives of the present invention are used, are subjected to burning-in processing, the resulting lithographic printing plates show improved impression capacity substantially with no stain on the nonimage area irrespective of the burning-in temperature as compared with that obtained from the lithographic printing plate of Comparative Example 1 in which no phenol compound is used. On the contrary, the compounds described in JP-B-1-49932 produce no effect at all on resistance to scumming of the non-image area, only showing an effect on impression capacity when added in an increased amount as in Comparative Examples 3 and 5.

Further, the lithographic printing plates of Examples 1 to 4 have increased sensitivity over that of Comparative Example 1. While the development latitude in Examples 1 to 4 shows slight reduction as compared with that in Comparative Example 1, the reduction is not much for practical use.

phenol derivative, no increase in sensitivity is obtained. In Examples 1 to 4, an increase in sensitivity is recognized, while not so pronounced as observed in Comparative Example 8.

From all these considerations, the phenol derivatives of the present invention are proved to cause no great reduction in development latitude, to increase sensitivity, to cause no deterioration in ink-receptivity, and, when burning-in processing is conducted, to markedly reduce scumming of the non-image area and, in addition, to bring about improved impression capacity irrespective of the burning-in temperature. Moreover, the phenol derivatives exhibit excellent solubility in solvents of a coating composition and do not cause dissolution of the image area during development processing.

That is, even when it is subjected to burning-in processing in high temperatures, the lithographic printing plate suffers from no burning-in ink spreading. The lithographic printing plate according to the present invention exhibits broad development latitude and excellent ink-receptivity and impression capacity.

While the invention has been described in detail and with reference to specific examples thereof, it will be apparent to one skilled in the art that various changes and modifications can be made therein without departing from the spirit and scope thereof.

What is claimed is:

1. A positive working photosensitive lithographic printing plate comprising a support having thereon a photosensitive layer comprising a positive working photosensitive composition, wherein the positive working photosensitive composition comprises a mixture of (a) a phenol derivative, (b) a water-soluble and aqueous alkali-soluble resin, and (c) o-quinonediazide or a mixture of a compound capable of forming an acid on exposure and a compound having at least one C—O—C group which is decomposable with an acid, and wherein the phenol derivative is a mixture of a compound represented by the following formula (I) and a compound represented by the following formula (II):

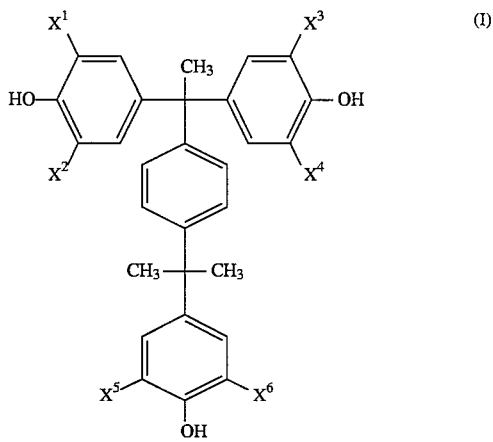

wherein $X^1$, $X^2$, $X^3$, $X^4$, $X^5$ and $X^6$ are the same or different and each represents —$CH_2OH$ or a hydrogen atom, provided that at least three of them are each —$CH_2OH$;

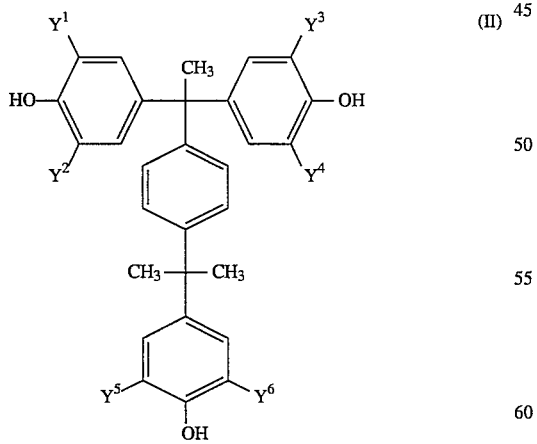

wherein $Y^1$, $Y^2$, $Y^3$, $Y^4$, $Y^5$ and $Y^6$ are the same or different and each represents —$CH_2OCH_3$, —$CH_2OH$ or a hydrogen atom, provided that at least three of them are each —$CH_2OCH_3$ or —$CH_2OH$, and at least one of the three is —$CH_2OCH_3$, wherein the compound represented by formula (I) and the compound represented by formula (II) are used at a weight ratio of from 98:2 to 10:90.

2. The positive working photosensitive lithographic printing plate as claimed in claim 1, wherein four or more of $X^1$, $X^2$, $X^3$, $X^4$, $X^5$ and $X^6$ in formula (I) are each —$CH_2OH$; and four or more of $Y^1$, $Y^2$, $Y^3$, $Y^4$, $Y^5$ and $Y^6$ in formula (II) are each —$CH_2OCH_3$ or —$CH_2OH$, provided that at least one of them is —$CH_2OCH_3$.

3. The positive working photosensitive lithographic printing plate as claimed in claim 1, wherein all of the $X^1$, $X^2$, $X^3$, $X^4$, $X^5$ and $X^6$ in formula (I) are each —$CH_2OH$; and all of $Y^1$, $Y^2$, $Y^3$, $Y^4$, $Y^5$ and $Y^6$ in formula (II) are each —$CH_2OCH_3$ or —$CH_2OH$, provided that at least one of them is —$CH_2OCH_3$.

4. The positive working photosensitive lithographic printing plate as claimed in claim 1, wherein the water-insoluble and aqueous alkali-soluble resin is a novolak resin.

5. The positive working photosensitive lithographic printing plate as claimed in claim 1, wherein the water-insoluble and aqueous alkali-soluble resin is used in an amount of from 5 to 99% by weight based on the total solids content of the photosensitive composition.

6. The positive working photosensitive lithographic printing plate as claimed in claim 1, wherein the o-quinonediazide is used in an amount of from 1 to 50% by weight based on the total solids content of the photosensitive composition.

7. The positive working photosensitive lithographic printing plate as claimed in claim 1, wherein the compound capable of forming an acid on exposure is used in an amount of from 0.1 to 10% by weight based on the total solids content of the photosensitive composition; and the compound having at least one C—O—C group which is decomposable with an acid is used in an amount of from 8 to 65% by weight based on the total solids content of the photosensitive composition.

* * * * *